(12) United States Patent
Nakazawa et al.

(10) Patent No.: US 9,216,882 B2
(45) Date of Patent: Dec. 22, 2015

(54) BATTERY POWERED WORK MACHINE, AND BATTERY POWERED FORKLIFT

(71) Applicant: Komatsu Ltd., Tokyo (JP)

(72) Inventors: Norikazu Nakazawa, Oyama (JP); Kazuhiro Kurita, Yuki (JP)

(73) Assignee: Komatsu Ltd., Tokyo (JP)

(*) Notice: Subject to any disclaimer, the term of this patent is extended or adjusted under 35 U.S.C. 154(b) by 161 days.

(21) Appl. No.: 13/990,502

(22) PCT Filed: Jan. 8, 2013

(86) PCT No.: PCT/JP2013/050131
§ 371 (c)(1),
(2) Date: May 30, 2013

(87) PCT Pub. No.: WO2014/109005
PCT Pub. Date: Jul. 17, 2014

(65) Prior Publication Data
US 2015/0053489 A1    Feb. 26, 2015

(51) Int. Cl.
*B60L 11/18* (2006.01)
*B66F 9/075* (2006.01)
*H05K 7/20* (2006.01)
*B60K 1/00* (2006.01)

(52) U.S. Cl.
CPC ......... *B66F 9/07572* (2013.01); *B60L 11/1874* (2013.01); *B66F 9/075* (2013.01); *B66F 9/07531* (2013.01); *H05K 7/20863* (2013.01); *B60K 2001/003* (2013.01); *B60L 2200/42* (2013.01); *B60L 2200/44* (2013.01)

(58) Field of Classification Search
CPC ..... B60L 11/00; B60L 11/18; B60L 11/1874; B60L 2200/42; B60L 2200/44; B60K 2001/003; B60K 2001/005; B60K 2001/006; H05K 7/20863; B66F 9/075; B66F 9/07527
See application file for complete search history.

(56) References Cited

U.S. PATENT DOCUMENTS

| | | | |
|---|---|---|---|
| 5,740,015 A * | 4/1998 | Donegan et al. | 361/699 |
| 5,946,188 A * | 8/1999 | Rochel et al. | 361/690 |
| 6,201,365 B1 * | 3/2001 | Hara et al. | 318/558 |
| 6,226,582 B1 | 5/2001 | Adsett et al. | |
| 6,457,542 B1 * | 10/2002 | Hosono et al. | 180/68.1 |
| 6,493,227 B2 | 12/2002 | Nielsen et al. | |
| 7,481,288 B2 | 1/2009 | Makuta et al. | |
| 2002/0064028 A1 | 5/2002 | Nielsen et al. | |
| 2004/0163861 A1 * | 8/2004 | Fukuda et al. | 180/65.2 |

(Continued)

FOREIGN PATENT DOCUMENTS

| | | |
|---|---|---|
| CN | 1736790 A | 2/2006 |
| CN | 1965434 A | 5/2007 |

(Continued)

OTHER PUBLICATIONS

International Search Report dated Feb. 26, 2013, issued for PCT/JP2013/050131.

*Primary Examiner* — Frank Vanaman
(74) *Attorney, Agent, or Firm* — Locke Lord LLP; James E. Armstrong, IV; Brian S. Matross

(57) ABSTRACT

A heat sink includes a first part on which a control device is attached, a second part on which an electronic component is attached and that is arranged to be opposite to the first part, and plural air passages provided between the first part and the second part for allowing air to pass. Plural plate-like members are arranged between the first part and the second part, and the air passage is formed by a space enclosed by the first part, the adjacent partition member, and the second part.

14 Claims, 8 Drawing Sheets

(56) References Cited

U.S. PATENT DOCUMENTS

| | | |
|---|---|---|
| 2006/0040154 A1 | 2/2006 | Makuta et al. |
| 2007/0247811 A1 | 10/2007 | Ohmi |
| 2007/0248861 A1 | 10/2007 | Hoshi |
| 2009/0016021 A1* | 1/2009 | Kim et al. ............... 361/697 |
| 2010/0182750 A1 | 7/2010 | Ehama |
| 2012/0044640 A1* | 2/2012 | Harada et al. ............ 361/688 |
| 2012/0118528 A1 | 5/2012 | Al-Ali |

FOREIGN PATENT DOCUMENTS

| | | |
|---|---|---|
| CN | 201570564 U | 9/2010 |
| DE | 196 28 545 A1 | 1/1998 |
| DE | 100 58 574 A1 | 6/2002 |
| DE | 10 2011 004 603 A1 | 6/2012 |
| JP | 61-013946 U | 1/1986 |
| JP | 61-112647 U | 7/1986 |
| JP | 05-183284 A | 7/1993 |
| JP | 05-259673 A | 10/1993 |
| JP | 05-318274 A | 12/1993 |
| JP | 2001-089092 A | 4/2001 |
| JP | 2002-314277 A | 10/2002 |
| JP | 2005-200200 A | 7/2005 |
| JP | 2007-288061 A | 11/2007 |
| JP | 2010-163260 A | 7/2010 |

* cited by examiner

BATTERY POWERED WORK MACHINE, AND BATTERY POWERED FORKLIFT

FIELD

The present invention relates to a battery powered work machine, and a battery powered forklift that carries out work with a battery.

BACKGROUND

As a battery powered work machine, there has been known a forklift that loads and unloads cargo and moves the cargo by using a fork mounted on the front part of the body of the machine. The forklift described above travels and performs a cargo handling operation with a battery mounted on the body (for example, Patent Literature 1).

CITATION LIST

Patent Literature

Patent Literature 1: Japanese Laid-open Patent Publication No. 2001-089092

SUMMARY

Technical Problem

The battery powered work machine includes a control device and an electronic component for controlling an electric motor for work and for controlling an electric motor for driving the work machine. The control device and the electronic component generate heat during the operation, so that they have to be cooled. Patent Literature 1 describes a cooling structure including a fin on one surface of a controller (control device). When there are plural subjects to be cooled, the fin is needed according to the number of the subjects to be cooled in the cooling structure described above. Therefore, the space for installing the cooling structure becomes large.

The present invention aims to make the installation space compact, when a radiator is mounted to a subject to be cooled to release heat from the subject in a battery powered work machine.

Solution to Problem

According to the present invention, a battery powered work machine comprises: a first part to which a heating element is attached; a second part to which a heating element different from the heating element attached to the first part is attached, the second part being arranged to be opposite to the first part; and plural air passages provided between the first part and the second part for allowing air to pass, wherein plural plate-like partition members are arranged between the first part and the second part to couple the first part and the second part, and the air passage is formed by a space enclosed by the partition member adjacent to the first part, and the second part, the battery powered work machine further comprises: a radiator including the first part, the second part, and the plural partition members that are integrally formed, wherein each of the first part and the second part is attached in such a manner that a part other than a portion where the plural air passages are open and a portion where the heating element is attached, is brought into contact with a subject to be attached.

In the present invention, it is preferable that at least two air passages have different sizes in a direction from the first part toward the second part.

According to the present invention, a battery powered work machine comprises: a first part to which a heating element is attached; a second part to which a heating element different from the heating element mounted on the first part is attached, the second part being arranged to be opposite to the first part; and plural air passages provided between the first part and the second part for allowing air to pass, wherein a first structure formed by providing plural plate-like members on the first part and a second structure formed by providing plural plate-like members on the second part are combined in such a manner that an end of the plate-like member of the first structure and an end of the plate-like member of the second structure face each other, the battery powered work machine further comprises: a radiator including the air passage that is formed by a space enclosed by the first part, the adjacent plate-like member, and the second part, wherein each of the first part and the second part is attached in such a manner that a part other than a portion where the plural air passages are open and a portion where the heating element is attached, is brought into contact with a subject to be attached.

According to the present invention, a battery powered work machine including a device that is operated by operating oil, the battery powered work machine comprises: an operating oil tank storing the operating oil; a first part to which a heating element is attached; a second part to which a heating element different from the heating element attached on the first part is attached, the second part being arranged to be opposite to the first part; and plural air passages provided between the first part and the second part for allowing air to pass, wherein plural plate-like partition members are arranged between the first part and the second part to couple the first part and the second part, and the air passage is formed by a space enclosed by the partition member adjacent to the first part, and the second part, the battery powered work machine further comprises: a radiator including the first part, the second part, and the plural partition members that are integrally formed, wherein the radiator and the operating oil tank are arranged side by side.

According to the present invention, a battery powered work machine including a device that is operated by operating oil, the battery powered work machine comprises: an operating oil tank storing the operating oil; a first part to which a heating element is attached; a second part to which a heating element different from the heating element mounted on the first part is attached, the second part being arranged to be opposite to the first part; and plural air passages provided between the first part and the second part for allowing air to pass, wherein a first structure formed by providing plural plate-like members on the first part and a second structure formed by providing plural plate-like members on the second part are combined in such a manner that an end of the plate-like member of the first structure and an end of the plate-like member of the second structure face each other, the battery powered work machine further comprises: a radiator including the air passage that is formed by a space enclosed by the first part, the adjacent plate-like member, and the second part, wherein the radiator and the operating oil tank are arranged side by side.

According to the present invention, a battery powered forklift comprises: a fork mounted on a front of a body to which a front wheel and a rear wheel are attached; a counter weight provided on a rear of the body; a driving electric motor that is driven by electric power fed from a battery for allowing the body to travel; a cargo-handling electric motor that is driven by electric power fed from the battery for allowing operating oil that operates the fork to generate oil pressure; an operating oil tank that stores the operating oil; a first part to which a first control device for controlling the driving electric motor and a second control device for controlling the cargo-handling electric motor are attached; a second part to which an electronic component is attached, the second part being arranged to be opposite to the first part; and plural air passages provided between the first part and the second part for allowing air to pass, wherein plural plate-like partition members are arranged between the first part and the second part to couple the first part and the second part, and the air passage is formed by a space enclosed by the partition member adjacent to the first part, and the second part, the battery powered forklift further comprises: a radiator including the first part, the second part, and the plural partition members that are integrally formed, the radiator being arranged side by side with the operating oil.

According to the present invention, a battery powered forklift comprises: a fork mounted on a front of a body on which a front wheel and a rear wheel are attached; a counter weight provided on a rear of the body; a driving electric motor that is driven by electric power fed from a battery for allowing the body to travel; a cargo-handling electric motor that is driven by electric power fed from the battery for allowing operating oil that operates the fork to generate oil pressure; an operating oil tank that stores the operating oil; a first part to which a first control device for controlling the driving electric motor and a second control device for controlling the cargo-handling electric motor are attached; a second part to which an electronic component is attached, the second part being arranged to be opposite to the first part; and plural air passages provided between the first part and the second part for allowing air to pass, wherein a first structure formed by mounting plural plate-like members on the first part and a second structure formed by mounting plural plate-like members on the second part are combined in such a manner that an end of the plate-like member of the first structure and an end of the plate-like member of the second structure face each other, the battery powered forklift further comprises: a radiator including the air passage that is formed by a space enclosed by the first part, the adjacent plate-like member, and the second part, the radiator being arranged side by side with the operating oil.

In the present invention, it is preferable that the first control device, the second control device, the electronic component, and the radiator are stored in a storage space in which the cargo-handling electric motor and the operating oil tank storing the operating oil are stored.

In the present invention, it is preferable that the first control device is arranged anterior to the second control device on the body.

In the present invention, it is preferable that the electronic component is attached to a position opposite to the second control device.

In the present invention, it is preferable that the storage space is provided in the body, below a bottom of the battery, and above a bottom of the body.

Advantageous Effects of Invention

The present invention can make the installation space compact, when a radiator is mounted to a subject to be cooled to release heat from the subject in a battery powered work machine.

DESCRIPTION OF EMBODIMENTS

The embodiments of the present invention will be described in detail with reference to the drawings.

Figure 1:
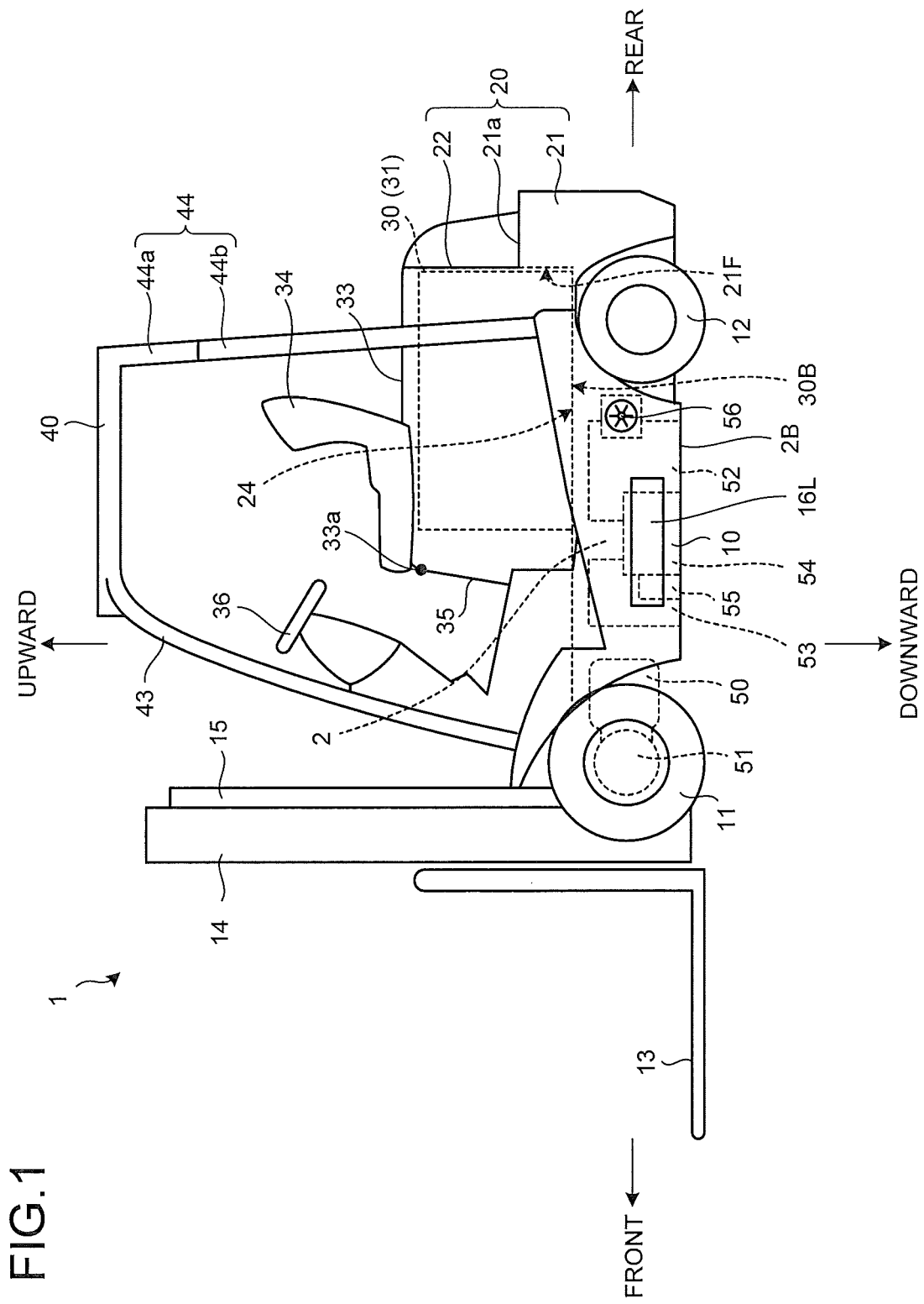
FIG. 1 is a side view illustrating a work machine according to an embodiment of the present invention viewed from left.
Figure 2:
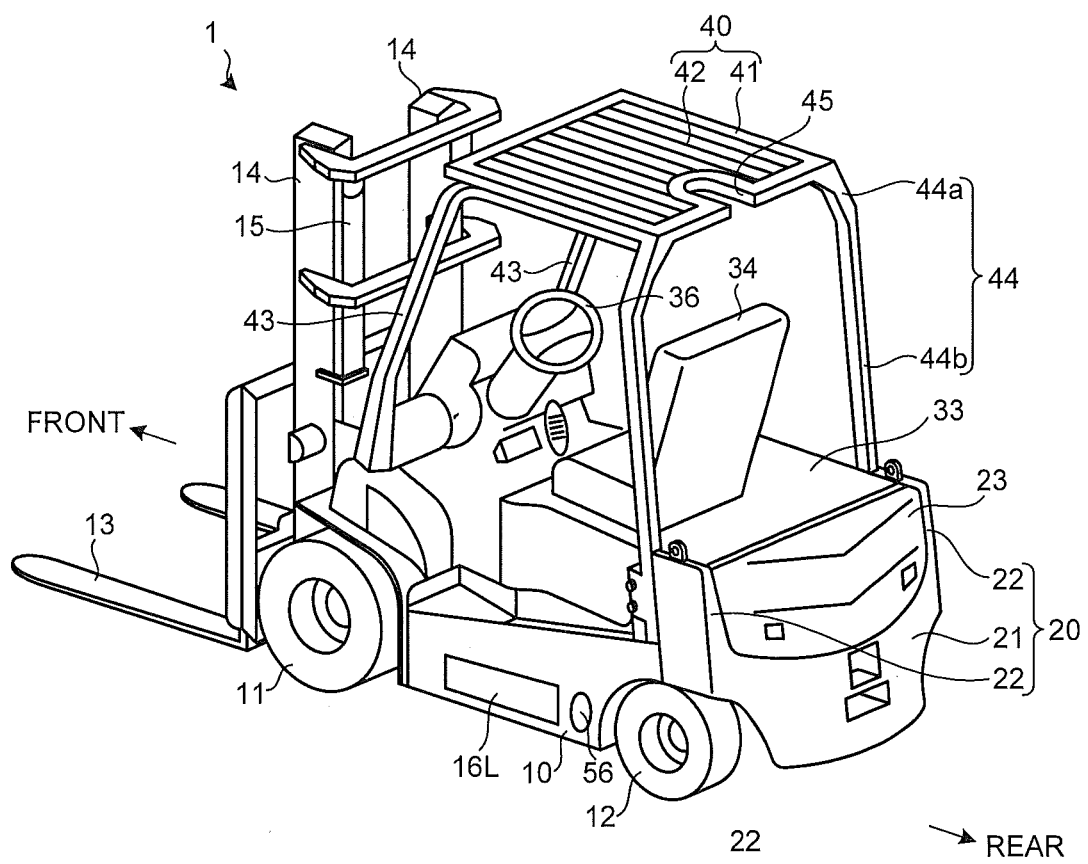
FIG. 2 is a perspective view illustrating the work machine according to the embodiment of the present invention viewed from obliquely above on left rear part.

FIG. 1 is a side view illustrating a work machine according to an embodiment of the present invention viewed from left. FIG. 2 is a perspective view illustrating the work machine according to the embodiment of the present invention viewed from obliquely above on left rear part. A battery powered forklift 1 will be described below as the battery powered work machine in the present embodiment. However, the work machine is not limited thereto. For example, the work machine may be a wheel loader or an excavator that is driven by power from a battery or power supplied from a generator driven by an engine or the like.

In the description below, the side where a fork 13 is provided is a front side, while the side where a counter weight 20 is provided is a rear side in the battery powered forklift 1. When the work machine is not the battery powered forklift, the direction toward a steering wheel 36 serving as an operation device from a driver seat 34 is a front direction, while the direction toward the driver seat 34 from the steering wheel 36 is a rear direction. The operation device includes not only the steering wheel 36 used for steering the work machine, but also an operation lever for operating the work machine in an excavator or a wheel loader.

In the present embodiment, right and left are supposed to mean right and left with respect to the front. The lateral direction is a widthwise direction of a body 10 serving as a body of the work machine. The upward direction is a direction orthogonal to a plane (contact plane) that is in contact with at least three of front wheels 11 and rear wheels 12, and directing toward the rotation center shaft of the front wheel 11 and the rear wheel 12 from the contact plane. The downward direction is a direction toward the contact plane from the rotation center shaft of the front wheel 11 and the rear wheel 12. The axis in the longitudinal direction of the body 10, and passing through the center of the widthwise direction of the body 10 is referred to as a longitudinal axis, and an axis orthogonal to the longitudinal axis, and in the lateral direction of the body 10 is referred to as a lateral axis. The axis in the vertical direction of the body 10 is referred to as a vertical axis. The vertical axis is orthogonal to both the longitudinal axis and the lateral axis. In the description below, a planar view is supposed to be viewed from above.

<Overall Structure of Battery Powered Forklift 1>

The battery powered forklift 1 has respective front wheels 11 on front corners of the body 10, and respective rear wheels 12 on rear corners of the body 10. The battery powered forklift 1 travels, when a driving electric motor 50 provided posterior to the front wheel 11 drives the front wheels 11. More specifically, the output from the driving electric motor 50 is transmitted to both front wheels 11 and 11 via a power transmission device 51 having a deceleration function, in order to drive the front wheels 11 and 11.

The fork 13 is provided on the front of the body 10 in order to load and unload a cargo or move the cargo. The fork 13 is supported by a mast 14 provided along the vertical direction. The fork 13 moves up and down along the mast 14 by a drive of a mast cylinder 15 provided with the mast 14. Although not clearly illustrated in the figure, the mast 14 is attached to the body 10 so as to be capable of swinging about a lateral axis on its lower end. The mast 14 has a tilt cylinder, not illustrated, between the body 10. The mast 14 can take a forward tilting posture and a backward tilting posture with respect to the body 10 by the drive of the tilt cylinder.

A counter weight 20 is provided on the rear end of the body 10. As described above, the battery powered forklift 1 is a counter balance forklift in the present embodiment. However, the type of the battery powered forklift 1 is not limited thereto, and it may be a reach forklift, for example. The counter weight 20 is a weight for keeping the balance when the fork 13 holds the cargo. A metal is used for the counter weight 20, but the material is not limited thereto. The counter weight 20 is provided on the portion of the body 10 ranging from the portion above the rear wheel 12 to the rear end.

Figure 4:
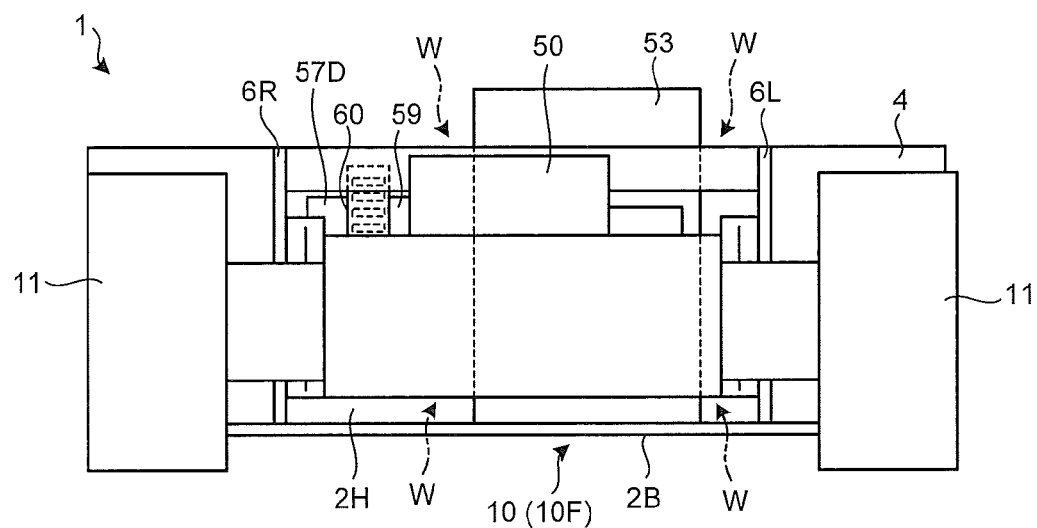
FIG. 4 is a front view of a body viewed from front.
Figure 5:
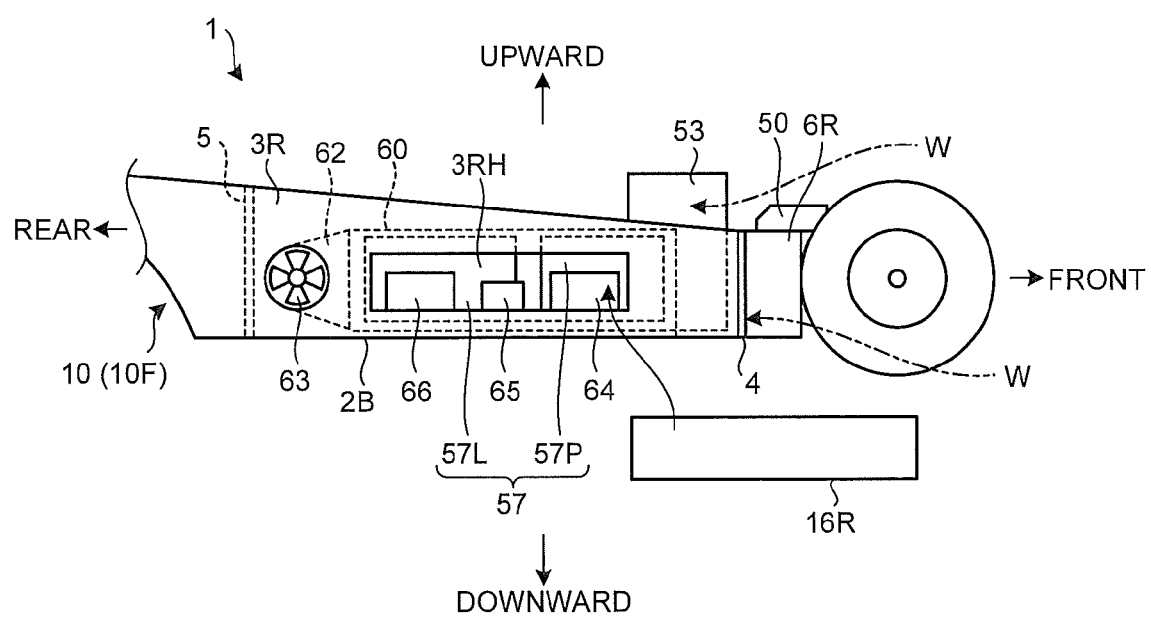
FIG. 5 is a side view of the body viewed from right.

As illustrated in FIG. 2, the counter weight 20 has a concave portion, open in the longitudinal direction, on the top surface. Specifically, the counter weight 20 having the concave portion on its top surface is configured such that a pair of columnar members 22 is formed to project upward on both sides of a weight body 21 having a flat top surface. The columnar members 22 are projecting portions projecting upward and to the front of the body 10 from the portions, opposite to each other, on both sides of the weight body 21, and having guide surfaces 22a that are parallel to each other along the longitudinal direction of the body 10. The columnar members 22 are formed integral with the weight body 21. FIGS. 4 and 5 illustrate a resin weight cover 23 that covers the back surface of the counter weight 20.

As illustrated in FIG. 1, a battery 30 serving as a power supply is mounted on the central part of the body 10. The battery 30 is an open type in which plural battery cells are stored in a battery case 31 having a rectangular solid shape with the top surface open, and the battery cells are open. The battery 30 is not limited to the open type described above, and it may be an easy-maintenance battery. The battery case 31 is formed such that the size along the widthwise direction of the body 10 is set to be slightly smaller than the distance between the pair of columnar members 22, whereby the battery case 31 can pass between the pair of columnar members 22. As illustrated in FIG. 1, the battery 30 is placed onto a battery setting surface 24 formed on the body 10 to be anterior to a front surface 21F of the weight body 21 and below a top surface 21a of the weight body 21. The battery setting surface 24 is set such that, when the battery 30 is mounted, the upper part of the battery 30 on the rear end is present between the columnar members 22, and is overlapped with the counter weight 20.

A battery hood 33 is provided above the battery 30 placed onto the battery setting surface 24, and the driver seat 34 is arranged on the top surface of the battery hood 33. The battery hood 33 has a size large enough for covering the top surface of the battery case 31, and is supported to a support bracket 35 of the body 10 on its front end via a support shaft 33a along the lateral direction of the body 10. The support bracket 35 supporting the battery hood 33 is formed to erect upward from the position on the front end of the battery setting surface 24. The battery hood 33 is movable by the rotation about the support shaft 33a between a horizontal position where the battery hood 33 covers the battery 30 from above and a forward tilting position where the rear end of the battery hood is flipped up to open the battery 30.

In order to exchange the battery 30, the battery hood 33 is moved to be on the forward tilting position by which the portion above the battery 30 is open. With this state, the battery 30 is lifted up above the body 10, pulled out backward, and extracted. The charged battery 30 is hung down, and with this state, moved to the portion above the battery setting surface 24 from the rear of the body 10, and mounted on the battery setting surface 24.

As illustrated in FIG. 1, a top plate 40 is provided above the body 10. As illustrated in FIG. 2, the top plate 40 has plural bars 42 arranged on an approximately rectangular frame body 41 with a size for covering the driver seat 34 from above. The size of the top plate 40 along the widthwise direction of the body 10 is smaller than the body 10. The top plate 40 is attached to the body 10 via a pair of front stays 43 and a pair of rear stays 44.

As illustrated in FIG. 1, the front stays 43 extend downward from the front corner of the top plate 40 so as to tilt forward, and each lower end is fixed to the front end of the body 10. The distance between the front stays 43 is approximately equal along the entire length. Each of the rear stays 44 has an expanding portion 44a that linearly projects downward from the rear corner of the top plate 40, the expanding portions 44a being formed to separate from each other toward the side, and a stay body 44b that extends almost downward in the vertical direction from the lower end of the expanding portion 44a and is fixed to the rear end of the body 10 on its lower end.

The distance between the stay bodies 44b, parallel to each other, of the rear stays 44 is almost the same as the distance between the columnar members 22, whereby the battery case 31 and the battery hood 33 can pass between the stay bodies 44b. The position where the stay body 44b and expanding portion 44a cross each other is set as high as possible in order not to interfere with the rear stay 44 even when the battery hood 33 on the horizontal position is moved to the forward tilting position, and in order not to interfere with the battery case 31 even when the battery 30 is moved to the battery transfer position.

As illustrated in FIG. 1, a storage space 2 is formed in the body 10 below the bottom 30B of the battery 30 and above the bottom 2B of the body 10. In the storage space 2, a cargo-handling electric motor 52 and an operating oil tank 53 are stored. The cargo-handling electric motor 52 generates power for allowing the operating oil, which operates the fork 13 serving as equipment operating with the operating oil, to generate oil pressure. The operating oil tank 53 stores operating oil therein.

The cargo-handling electric motor 52 and the driving electric motor 50 are controlled by the control device. In order to exchange the battery 30 in the battery powered forklift 1, the battery 30 is lifted up, and moved backward. The driver seat 34 is provided above the battery 30 in the battery powered forklift 1. Therefore, the control device cannot be arranged above and posterior to the battery 30 in the battery powered forklift 1, which means the arrangement of the control device is limited. In the battery-powered forklift of counter balance type, in particular, the arrangement of the control device is further limited, since not only the battery 30 but also the counter weight are mounted on the body. In the present embodiment, the above-mentioned control device is stored together with the cargo-handling electric motor 52 and the operating oil tank 53 in the storage space 2 below the battery 30. With this structure, the limited storage space in the battery powered forklift 1 having a counter weight can effectively be used. The arrangement of the control device, the cargo-handling electric motor 52, and the operating oil tank 53 in the storage space 2 will be described later.

In the present embodiment, a charging device 54 for charging the battery 30 is further stored in the storage space 2. When the above-mentioned easy-maintenance battery is used as the battery 30, the charging device 54 is a battery controller having not only a charging function but also a function of monitoring the state of the battery 30. An access door 16L for exchanging a fuse 55 of the charging device 54 or checking the charging device 54 is provided on the side face (on the left side face in FIGS. 1 and 2) of the body 10. Although not illustrated in FIGS. 1 and 2, an access door used for checking equipment (in the present embodiment, the control device described above) provided on the right side in the storage space 2 is also provided on the right side face of the body 10.

In the present embodiment, the control device serving as a device (heating element) generating heat is stored in the storage space 2 in addition to the device (heating element) generating heat, such as the cargo-handling electric motor 52 and the operating oil tank 53. This is because, in the counter balance battery powered forklift 1, the control device is arranged in the storage space 2, not above the battery 30, in consideration of the exchange of the battery 30. As a result, the storage space 2 has an environment in which temperature is likely to rise. Therefore, the body 10 includes a fan 56 for discharging air in the storage space 2 to the outside. Since the fan 56 discharges the air in the storage space 2 to the outside, the excessive temperature rise in the storage space 2 can be prevented. By virtue of this structure, in the battery powered forklift 1 of counter balance type having limitation in the arrangement of the devices represented by the control device, the control device can be stored in the body 10, and the excessive temperature rise of the control device, the cargo-handling electric motor 52, the operating oil tank 53 and the like can be prevented.

The battery powered forklift 1 performs a cargo handling operation with the state in which the battery 30 placed onto the battery setting surface 24 is covered by the battery hood 33, and the back surface of the counter weight 20 is covered by the weight cover 23 illustrated in FIG. 2. Specifically, the operator seated on the driver seat 34 operates to drive the battery powered forklift 1 with the front wheels 11 driven by the driving electric motor 50, and moves the fork 13 up and down, as needed, thereby being capable of carrying out the desired cargo handling operation.

In the battery powered forklift 1, a part of the battery 30 is located on the rear beyond the rear stays 44 supporting the top plate 40, and overlapped with the counter weight 20 on the body 10. Accordingly, the mass of the battery 30 effectively functions as the balance weight, so that the mass of the counter weight 20 can significantly be reduced. As a result, the mass of the body 10 is reduced, whereby energy saving, such as reduction in power consumption of the battery 30, can be realized.

Since the battery 30 is mounted on the position above the rear wheels 12 in the battery powered forklift 1, the size of the battery 30 in the widthwise direction can be secured to be large. Accordingly, even when the battery 30 having the same mass is mounted, the size of the battery 30 in the longitudinal direction becomes small, whereby the battery 30 can be arranged more to the rear of the body 10. Consequently, the battery 30 can more effectively be used as the balance weight in the battery powered forklift 1. Next, the arrangement of the devices in the storage space 2 will be described in more detail.

<Arrangement of Devices in Storage Space 2>

Figure 3:
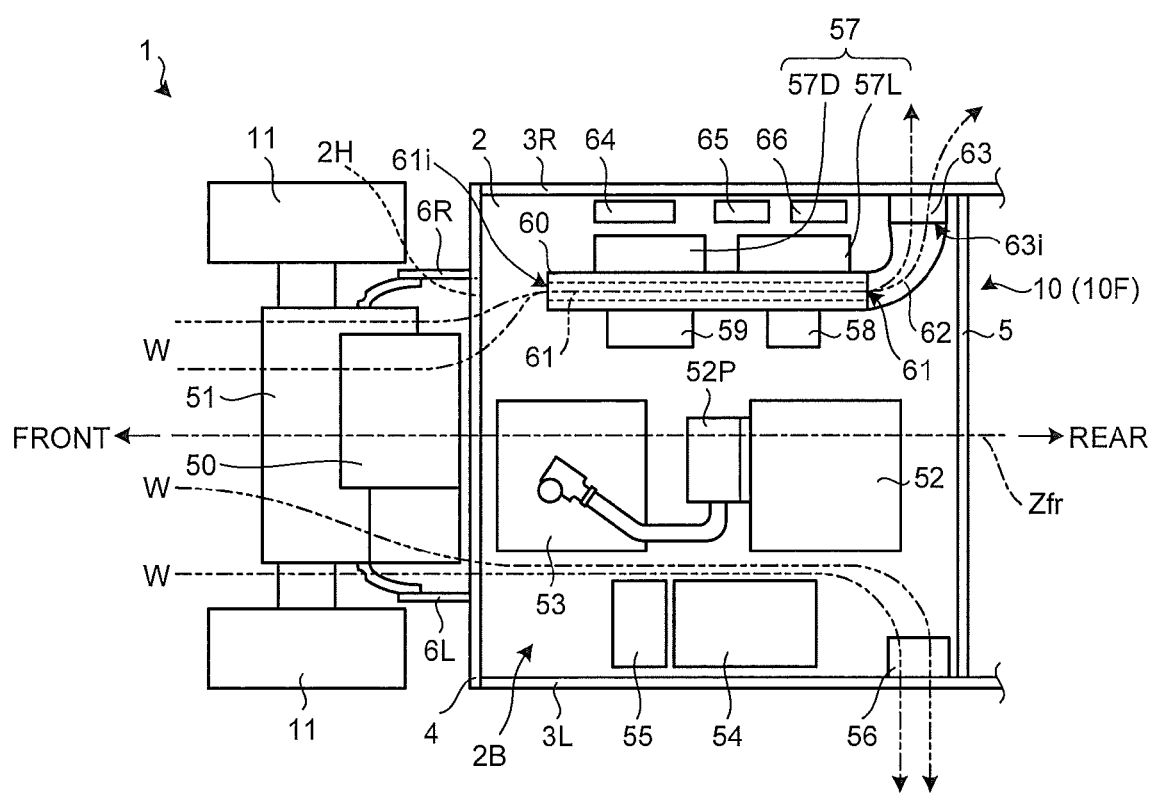
FIG. 3 is a plan view of a storage space in which devices are stored.
Figure 6:
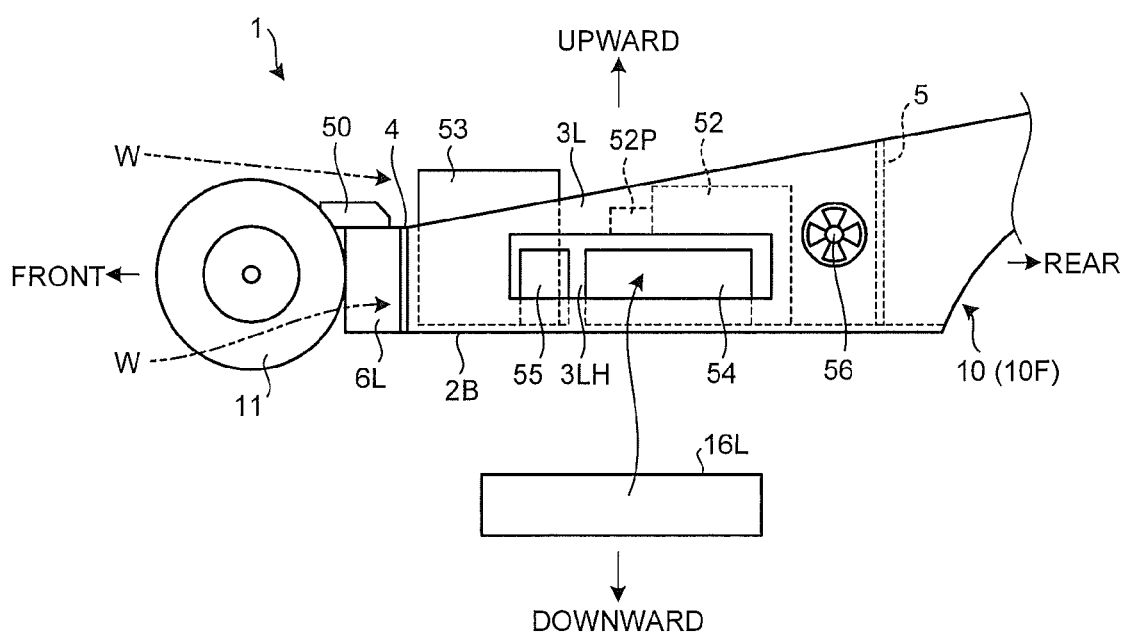
FIG. 6 is a side view of the body viewed from left.

FIG. 3 is a plan view of the storage space in which devices are stored. FIG. 4 is a front view of the body viewed from front. FIG. 5 is a side view of the body viewed from right. FIG. 6 is a side view of the body viewed from left. FIGS. 3 to 6 illustrate the forklift from which the structures present above the storage space 2, such as the driver seat 34, the support bracket 35, and the battery 30 illustrated in FIGS. 1 and 2, are removed.

The storage space 2 is a space enclosed by the bottom 2B, a pair of sides 3L and 3R erecting from the bottom 2B, a front partition 4 provided on the front of the body 10, and a rear partition 5 provided on the rear of the body 10. The bottom 2B, the sides 3L and 3R, the front partition 4, and the rear partition 5 are plate-like members. These members are combined and bonded by welding, whereby a frame 10F of the body 10 is formed, for example. The bottom 2B is a member having an approximately rectangular shape (including a square) in the planar view. The sides 3L and 3R, the front partition 4, and the rear partition 5 are provided along four sides of the bottom 2B. Therefore, the storage space 2 has the approximately rectangular shape (including a square) in the planar view.

The sides 3L and 3R, the front partition 4, and the rear partition 5 are provided to erect from the bottom 2B, i.e., to stand from the bottom 2B. Specifically, the sides 3L and 3R, the front partition 4, and the rear partition 5 are provided to have a predetermined angle (in the present embodiment, almost 90 degrees) with the bottom 2B. The side 3L is provided on the left of the body 10, while the side 3R is provided on the right of the body 10. The side 3L and the side 3R are opposite to each other across a longitudinal shaft Zfr. The side 3L is referred to as the left side 3L, while the side 3R is referred to as the right side 3R, if the sides 3L and 3R have to be distinguished.

The front partition 4 is a partition wall between the front part of the body 10 and the storage space 2, while the rear partition 5 is a partition wall between the rear part of the body 10 and the storage space 2. The left side 3L is a partition wall between the left part of the body 10 and the storage space 2, while the right side 3R is a partition wall between the right part of the body 10 and the storage space 2. It is only necessary that the frame 10F has at least the bottom 2B and a pair of sides 3L and 3R, and the frame is not limited to that having the above-mentioned structure.

The power transmission device 51 that is formed integral with the driving electric motor 50 is attached to the front partition 4 via a pair of support members 6L and 6R. The right and left front wheels 11 and 11 are attached to the power transmission device 51. In the present embodiment, the left and right front wheels 11 and 11 are arranged at the outside of the respective support members 6L and 6R in the widthwise direction. In the present embodiment, the support members 6L and 6R are plate-like members extending in the vertical direction at the front of the frame 10F. The pair of support members 6L and 6R sandwiches the driving electric motor 50 and the power transmission device 51 from both sides for supporting the same, and couples these devices with the frame 10F.

In the present embodiment, the cargo-handling electric motor 52 for driving an oil pump 52P, the operating oil tank 53, the charging device 54, the fuse 55 of the charging device 54, a control device 57, electronic components 58 and 59, a heat sink 60 serving as a radiator, a relay storage case 64 storing various relays, and fuses 65 and 66 of the control device 57 are stored in the storage space 2. The cargo-handling electric motor 52 and the operating oil tank 53 are arranged along the longitudinal direction of the body 10. The control device 57 and the charging device 54 are arranged on both sides of the body 10 in the widthwise direction. In the present embodiment, the cargo-handling electric motor 52 and the operating oil tank 53 are arranged to include a virtual straight line extending in the longitudinal direction on the center of the body 10 in the widthwise direction, i.e., the longitudinal axis Zfr, in the projected view from above the body 10. Since the cargo-handling electric motor 52 and the operating oil tank 53, which have a large mass, are collectively arranged on the center in the widthwise direction of the body 10, and the charging device 54 and the control device 57 are respectively arranged on both sides in the widthwise direction, the mass unbalance between left and right of the body 10 can be prevented.

In the battery powered forklift 1, the control device 57 is stored in the storage space 2 below the battery 30 together with the cargo-handling electric motor 52, the operating oil tank 53, the charging device 54, various relays, and the like. Therefore, the wiring between the control device 57 and the cargo-handling electric motor 52 and the wiring between the control device 57 and the driving electric motor 50 can be decreased, and the degree of freedom in the layout of the wiring is enhanced. The same applies to the wiring between the control device 57 and various relays. Since the control device 57 and the charging device 54 are stored in the storage space 2 provided below the battery 30, the wiring between these devices and the battery 30 can be decreased, and the degree of freedom in the layout of the wiring is enhanced. As described above, in the battery powered forklift 1, the devices such as the control device 57 and the cargo-handling electric motor 52 are collectively stored in the storage space 2 below the battery 30. Therefore, the battery powered forklift 1 has an advantage of decreasing the wiring, and enhancing degree of freedom in the layout of the wiring.

Since the control device 57 is stored below the battery 30, the control device 57 does not hinder the movement of the battery 30 that is moved backward after being lifted up. As described above, the control device 57 is provided on the portion out of the way of the exchange of the battery in the present embodiment.

As illustrated in FIGS. 3 and 4, the storage space 2 has an opening 2H on its front. In the present embodiment, the operating oil tank 53 is arranged anterior to the cargo-handling electric motor 52 on the body 10. With this structure, the operating oil tank 53 having large amount of heat generation is cooled, since air W flowing into the storage space 2 from the opening 2H first collides against the operating oil tank 53. As a result, the operating oil tank 53 can efficiently be cooled by the arrangement of the devices as described above.

In the present embodiment, fans 56 and 63 for exhausting the inside air are provided in the storage space 2. The fan 56 is provided on the left of the body 10, while the fan 63 is provided on the right of the body. In the present embodiment, the fan 56 is attached to the left side 3L, while the fan 63 is attached to the right side 3R. As described above, the fans 56 and 63 are provided at least one on each side of the body 10 in the widthwise direction. In the present embodiment, each of the fans 56 and 63 is provided on each side of the body 10. However, two fans may be provided on the right side or on the left side of the body 10, for example.

The fans 56 and 63 exhaust air in the storage space 2 toward both sides of the body 10 in the widthwise direction, thereby being capable of preventing the cooling unbalance of the devices stored in the storage space 2. The fans 56 and 63 are preferably arranged to be close to the front part or to the rear part of the storage space 2. This structure can form the flow of the air W all over the longitudinal direction of the storage space 2, whereby the devices stored in the storage space 2 can efficiently be cooled. When the fans 56 and 63 are not used, many openings have to be formed on the body 10 in order to exhaust the air having increased temperature in the storage space 2. When there are many openings, water is easy to enter the storage space 2, which might affect the devices having relatively low resistance to water, such as the control device 57 and the cargo-handling electric motor 52. In the present embodiment, the air in the storage space 2 is exhausted by the fans 56 and 63, so that the number of the openings in the storage space 2 can be minimized. The fans 56 and 63 can prevent the water intrusion. Since the possibility of the water intrusion into the storage space 2 can be reduced, this structure is preferable for the devices having relatively low resistance to water, such as the control device 57 and the cargo-handling electric motor 52.

As described above, the storage space 2 has the opening 2H on its front. On the other hand, the back of the storage space 2 is partitioned by the rear partition 5. Therefore, the air W is easy to flow into the storage space 2 from the opening 2H on the front of the storage space 2. In the present embodiment, the devices stored in the storage space 2 are cooled by using the air W from the front opening 2H of the storage space 2 and the air W from above the front partition 4. Therefore, the fans 56 and 63 are both provided on the rear of the storage space 2. Specifically, the fans 56 and 63 are provided posterior to the control device 57 or the charging device 54 and anterior to the rear partition 5.

With this structure, the air W from front of the body 10 passes above and below the driving electric motor 50 and the power transmission device 51 and flows into the storage space 2 from the opening 2H and from above the front partition 4 as arrows indicated by two-dot-chain lines in FIGS. 3 to 6. The air W flowing into the storage space 2 flows toward the rear from the front in the storage space 2, is separated from each other in front of the rear partition 5, and is exhausted to the outside by the respective fans 56 and 63. As described above, the fans 56 and 63 forms the flow of the air W such that the air W, which is taken from the front opening 2H of the storage space 2 and from above the front partition 4, is flown toward rear from front, is separated from each other in front of the rear partition 5, and is exhausted to the outside of the storage space 2. As a result, the fans 56 and 63 can flow the air W taken from front of the body 10 all over the storage space 2, thereby being capable of efficiently cooling the devices stored in the storage space 2.

In the present embodiment, the cargo-handling electric motor 52 and the operating oil tank 53 are arranged along the longitudinal direction of the body 10, and the control device 57 and the charging device 54 are arranged on both sides of the body 10 in the widthwise direction. The arrangement of the devices described above brings an advantage of allowing the fans 56 and 63 to easily form the above-mentioned flow of the air W by using the space between the cargo-handling electric motor 52 and the operating oil tank 53, and the control device 57, and the space between the cargo-handling electric motor 52 and the operating oil tank 53, and the charging device 54.

As illustrated in FIG. 4, the driving electric motor 50 and the power transmission device 51 are arranged in front of the opening 2H of the storage space 2 in the present embodiment. The fork 13 and the mast 14 illustrated in FIG. 1 are attached to front of these devices. Therefore, even if liquid such as water is poured from front of the body 10, the intrusion of the liquid into the opening 2H can be prevented by the fork 13, the mast 14, the driving electric motor 50, and the power transmission device 51.

As illustrated in FIGS. 3 and 4, the opening 2H of the storage space 2 is provided between a pair of plate-like support members 6L and 6R provided on both sides of the front partition 4 in the widthwise direction. The pair of support members 6L and 6R provided on both sides of the opening 2H can prevent the air W from front of the body 10 from flowing toward the frame 10F, more specifically, toward left and right of the front partition 4. As a result, the opening 2H can efficiently take the air W from front of the body 10 into the storage space 2, whereby the cooling efficiency of the devices stored in the storage space 2 is enhanced.

In the present embodiment, the control device 57 includes a driving control device 57D for controlling the driving electric motor 50 as a first control device and a cargo-handling control device 57L for controlling the cargo-handling electric motor 52 as a second control device. These devices are attached to one surface of the heat sink 60 that is a plate-like structure. The electronic components 58 and 59 are attached to the other surface of the heat sink 60. The electronic component 58 is a DC/DC converter, for example, and the electronic component 59 is a contactor, for example.

The control device 57 is attached to the heat sink 60 so as to face the outside of the body 10, i.e., so as to face the outside in the widthwise direction, in the present embodiment. The control device 57 is provided near the right side 3R in the present embodiment. This structure can allow the control device 57, which is a heating element, to be provided close to the outside of the body 10 having lower temperature, whereby the temperature rise of the control device 57 can be prevented. The charging device 54 is provided on the position opposite to the outside of the body 10, more specifically, on the position opposite to the left side 3L. This structure can allow the charging device 54 to be mounted close to the outside of the body 10 having lower temperature, whereby the temperature rise of the charging device 54 can be prevented.

The heat sink 60 is provided on the bottom 2B of the body 10. A subject to be attached to the heat sink 60 is the bottom 2B of the body 10. In the present embodiment, the control device 57 and the electronic components 58 and 59 are attached to the bottom 2B of the body 10 via the heat sink 60. The control device 57 and the electronic components 58 and 59 are heating elements that emit heat when being operated. The heat sink 60 exhausts heat from the control device 57 and the electronic components 58 and 59 into the atmosphere to cool them.

In the present embodiment, the body 10 (more specifically, the frame 10F) is produced by bonding metal plates with welding. Since the heat sink 60 is attached to the bottom 2B of the body 10, the heat from the heat sink 60 is transmitted to the body 10, and released into the atmosphere with which the body 10 is in contact. Since the body 10 can also be used as a member for radiation by attaching the heat sink 60 on the bottom 2B of the body 10, the cooling efficiency of the control device 57 and the electronic components 58 and 59, which are attached to the heat sink 60, is enhanced.

In the present embodiment, the heat sink 60 has an air passage 61 therein. The heat sink 60 causes gas, i.e., the air W in the present embodiment, to pass through the air passage 61, thereby enhancing the cooling efficiency of the control device 57 and the electronic components 58 and 59. The heat sink 60 is formed with an air inlet 61i, facing the front of the storage space 2, i.e., facing the front partition 4, of the air passage 61, and is formed with an air exit 61e, facing the rear of the storage space 2, i.e., facing the rear partition 5, of the air passage 61. In the present embodiment, the air exit 61e and an air inlet 63i of the fan 63 are coupled with a duct 62. The air W is sucked by the fan 63, whereby the air W is forcibly flown into the air passage 61 of the heat sink 60. With this structure, the cooling efficiency of the control device 57 and the electronic components 58 and 59 by the heat sink 60 is enhanced. Since the air W is forcibly flown into the air passage 61, the part that is to be cooled can efficiently be cooled by the cooling structure described above. As a result, even if the control device 57 serving as the heating element is stored in the same space for the operating oil tank 53 and the cargo-handling electric motor 52, which are also the heating elements, the excessive temperature rise of the control device 57 can be prevented by the cooling structure according to the present embodiment.

The heat sink 60 and the operating oil tank 53 are arranged side by side. With this structure, the heat sink 60 can almost directly take the outside air of the body 10, not the high-temperature air in the storage space 2, into the cooling passage 61 from the front of the body 10. Accordingly, the cooling efficiency of the control device 57 and the electronic components 58 and 59 by the heat sink 60 is enhanced. From the viewpoint of efficiently introducing air from the front of the body 10 into the air passage 61, the air inlet 61i of the air passage 61 is preferably arranged as close to the front of the storage space 2 of the body 10 as possible. The air inlet 61i is preferably arranged anterior to the front end of the operating oil tank 53 provided in the storage space 2. This structure can reduce more possibility that the air, having increased temperature near the operating oil tank 53, flows into the air passage 61, whereby the cooling effect by the heat sink 60 to the control device 57 and the electronic components 58 and 59 is enhanced.

In the control device 57 attached to the heat sink 60, the driving control device 57D is arranged on the front of the body 10, while the cargo-handling control device 57L is arranged on the rear. In general, the traveling time is longer than the cargo-handling operation using the fork 13 in the battery powered forklift 1. Therefore, the operating time of the driving control device 57D is longer than the operating time of the cargo-handling control device 57L, so that the amount of heat generation of the driving control device 57D tends to be larger. The front part of the storage space 2 formed with the opening 2H is more advantageous for cooling. The temperature of the air W flowing through the air passage 61 of the heat sink 60 increases toward the flowing direction, i.e., from the air inlet 61i on the front of the body 10 toward the air exit 61e on the rear of the body 10. Therefore, in the battery powered forklift 1, the driving control device 57D whose temperature is easy to rise due to a large amount of heat generation is arranged on the front, in order to prevent the temperature rise of the driving control device 57D.

The electronic components 58 and 59 are attached to the surface of the heat sink 60 reverse to the surface on which the control device 57 is attached to. One (in the present embodiment, the electronic component 58) that is weaker against heat of the electronic components 58 and 59 is preferably attached to the position opposite to the cargo-handling control device 57L that has smaller amount of heat generation than the driving control device 57D. This structure can reduce the influence to the electronic component 58 by heat. The arrangement of the fuses 55, 65 and 66 will next be described.

The fuses 65 and 66 of the control device 57 are provided to be opposite to the right side 3R that is one of the pair of sides 3L and 3R. In the present embodiment, the relay storage case 64 is provided to be opposite to the right side 3R. The fuse 55 of the charging device 54 is provided to be opposite to the left side 3L that is the other one of the pair of sides 3L and 3R. Not the fuses 65, 66, and 55 but a fuse boxes storing these fuses may be provided to be opposite to the right side 3R or the left side 3L.

As illustrated in FIG. 5, the right side 3R is formed with a first opening 3RH on the position opposite to the fuses 65 and 66. As illustrated in FIG. 6, the left side 3L includes a second opening 3LH on the position opposite to the fuse 55. Access doors 16R and 16L are respectively attached to the first opening 3RH and the second opening 3LH to inhibit the water intrusion, when the maintenance process, the checking process, and the exchanging process are not carried out.

Since the control device 57 and the charging device 54 are arranged on the bottom 2B of the body 10 in the battery powered forklift 1, the maintenance process, the checking process, and the exchanging process for the fuses 65, 66, and 55 might be difficult. In the present embodiment, the fuses 65 and 66 for the control device 57 are arranged on the position closer to the right side 3R than to the control device 57 and opposite to the first opening 3RH of the right side 3R. The fuse 55 for the charging device 54 is arranged to be adjacent to the charging device 54 and to be opposite to the second opening 3LH of the left side 3L. In the present embodiment, the fuses 65 and 66 are involved with the travel, the cargo-handling operation, and the drive of the battery powered forklift 1, and it is arranged on the right of the battery powered forklift 1. The fuse 55 is involved with the charging of the battery 30, and it is arranged on the left of the battery powered forklift 1.

Since the fuses 65, 66, and 55 are arranged as described above, the fuses 65, 66, and 55 can easily be maintained, checked, and exchanged from the first opening 3RH and the second opening 3LH only by removing the access doors 16R and 16L. The fuses 65 and 66 for the control device 57 are arranged near the control device 57, while the fuse 55 for the charging device 54 is arranged near the charging device 54. Therefore, the wiring between the control device 57 and the fuses 65 and 66, and the wiring between the fuse 55 and the charging device 54 can be decreased, and further, the wiring layout is facilitated. The first opening 3RH and the second opening 3LH for the maintenance process, the checking process, and the exchanging process are formed one on each side of the body 10, which prevents the unnecessary increase in the number of the openings formed on the body 10. Since the possibility of the water intrusion into the storage space 2 can be reduced, this structure is preferable for the devices having relatively low resistance to water, such as the control device 57 and the cargo-handling electric motor 52. The heat sink 60 described above will next be described in more detail.

<Heat Sink 60>

Figure 7:
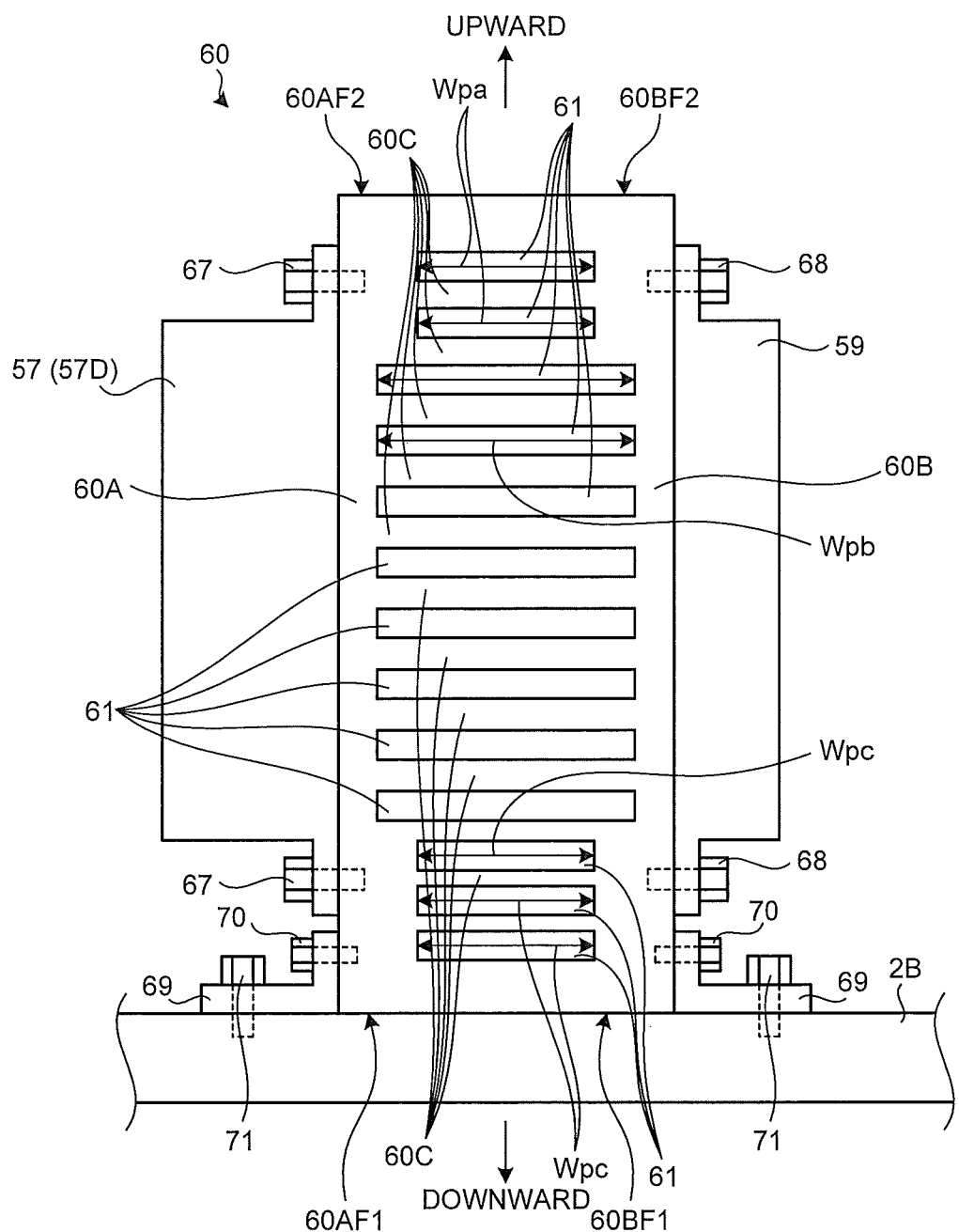
FIG. 7 is a front view of a heat sink according to the embodiment of the present invention.
Figure 8:
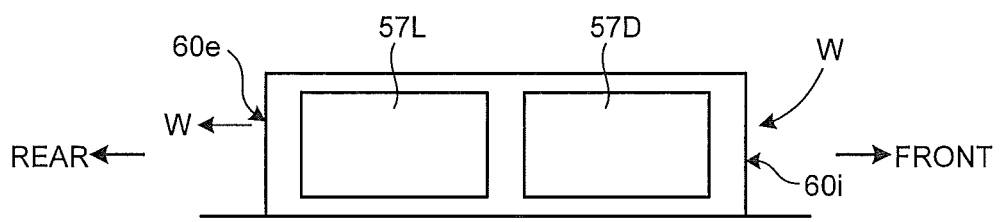
FIG. 8 is a side view of the heat sink according to the embodiment of the present invention.

FIG. 7 is a front view of the heat sink according to the embodiment of the present invention. FIG. 8 is a side view of the heat sink according to the embodiment of the present invention. The heat sink 60 is attached to the control device 57 and the electronic component 59, which are the subjects to be cooled, to discharge heat from them. The heat sink 60 is attached such that an attaching member 69 is attached by a bolt 70. The heat sink 60 is attached to the bottom 2B, which is the subject to which the heat sink 60 is to be attached, via the attaching member 69 and a bolt 71. The heat sink 60 may be attached to the bottom 2B by a bolt that is inserted from the side of the bottom 2B reverse to the side to which the heat sink 60 is attached, for example. The heat sink 60 includes a first part 60A, a second part 60B arranged opposite to the first part 60A, and plural air passages 61. On the first part 60A, the control device 57 (in the present embodiment, the driving control device 57D) that is the heating element is attached. On the second part 60B, the heating element different from the heating element attached to the first part 60A, i.e., the electronic component 59 in the present embodiment, is attached.

As illustrated in FIG. 7, the first part 60A and the second part 60B of the heat sink 60 are attached such that sides 60AF1 and 60BF1, which are a part of the portions (sides) other than the portion where the plural air passages 61 are open and the portion (side) where the control device 57 and the electronic component 59, serving as the heating element, are attached, are brought into contact with the bottom 2B so as to be opposite to the bottom 2B that is the subject to which the heat sink 60 is to be attached. The first part 60A and the second part 60B may be attached such that other sides 60AF2 and 60BF2, which are a part of the portion other than the portion to which the control device and the electronic component are attached, is brought into contact with the bottom 2B so as to be opposite to the bottom 2B.

Since the heat sink 60 is attached to the bottom 2B, the bottom 2B can be used as a radiation member. For this, the sides 60AF1 and 60BF1 of the first part 60A and the second part 60B opposite to the bottom 2B are brought into contact with the bottom 2B. A gel material (referred to as a heat-transfer material, according to need) having high thermal conductivity may be provided between the sides 60AF1 and 60BF1 and the bottom 2B. Examples of the heat-transfer material include a thermal grease or thermally conductive grease. The heat from the heat sink 60 can more efficiently be transmitted to the bottom 2B by the heat-transfer material provided between the sides 60AF1 and 60BF1 and the bottom 2B, whereby the control device 57 and the electronic component 59 can more efficiently be cooled.

Plural plate-like partition members 60C are arranged between the first part 60A and the second part 60B. The space enclosed by the first part 60A, the adjacent partition member 60C, and the second part 60B becomes the air passage 61. In the present embodiment, the heat sink 60 is made by extrusion molding of aluminum alloy, for example. Therefore, the heat sink 60 is formed such that the first part 60A and the second part 60B are coupled by the plural partition members 60C, and the first part 60A, the second part 60B, and the plural partition members 60C are formed integral. Since the first part 60A, the second part 60B, and the plural partition members 60C are formed integral as described above, the production cost of the heat sink 60 can be reduced.

The heating element that is the subject to be cooled can be attached to both of the first part 60A and the second part 60B of the heat sink 60. Accordingly, the arrangement space of the heat sink 60 in the body 10 can be made compact, compared to the case in which the heat sink for the control device 57 and the heat sink for the electronic component 59 are attached. Consequently, plural control devices 57 and the electronic component 59 can be cooled by effectively using the storage space 2 below the battery 30 in the battery powered forklift 1 by use of the heat sink 60. As described above, the heat sink 60 is effective for the case in which the plural devices of the battery powered forklift 1 are collectively stored in the storage space 2.

As illustrated in FIG. 8, the heat sink 60 introduces the air W from the air inlet 61i facing front, and cools the driving control device 57D and the cargo-handling control device 57L during when the air W passes through the air passage 61. The air W whose temperature increases due to the cooling of the driving control device 57D and the cargo-handling control device 57L is discharged from the air exit 61e facing rear. The heat sink 60 does not have a gap from the air inlet 61i toward the air exit 61e. Therefore, the heat sink 60 can collect dust from the outside of the storage space 2 into the flow of the air W, whereby the control device 57 and the electronic component 59 can be isolated from outside dust.

The control device 57 is attached to the heat sink 60 by a bolt 67, and the electronic component 59 is attached to the heat sink 60 by a bolt 68. The thickness of the portion, on which the bolts 67 and 68 are screwed, of the first part 60A and the second part 60B (the size from the first part 60A toward the second part 60B) becomes large, in order to secure the depth into which the bolts 67 and 68 are screwed. Therefore, at least two air passages 61 of the heat sink 60 have different size (width) in the direction from the first part 60A toward the second part 60B. Specifically, the widths of the air passages 61 on the portion where the bolts 67 and 68 are screwed on the upper part and the lower part are wpa and wpc, respectively, and the width of each of the air passages 61 between them is wpb. In this case, wpa<wpb, and wpc<wpb. In the present embodiment, wpa=wpc. The width wpa and the width wpc may be different from each other.

The widths wpa and wpc of the air passages 61 on the portions into which the bolts 67 and 68 are screwed are set to be smaller than the width wpc of the air passages 61 on the portions other than the portions into which the bolts 67 and 68 are screwed. Accordingly, the depth into which the bolts 67 and 68 are screwed can be secured, whereby the control device 57 and the electronic component 59 can surely be attached to the heat sink 60. When the thickness of the first part 60A and the thickness of the second part 60B are large, the extrusion molding carried out for producing the heat sink 60 becomes difficult. Therefore, when the thickness of the first part 60A and the thickness of the second part 60B are set to be large in order to secure the depth into which the bolts 67 and 68 are screwed, it becomes difficult to produce the heat sink 60 by the extrusion molding. When the widths of the air passages 61 on the portions where the bolts 67 and 68 are screwed are set to be smaller than the width of each of the air passages 61 on the portions other than the portions where the bolts 67 and 67 are screwed as described above, it is only necessary to locally increase the thickness of the first part 60A and the thickness of the second part 60B. With this structure, the depth into which the bolts 67 and 68 are screwed can be secured, and the heat sink 60 can be produced by the extrusion molding.

Figure 9:
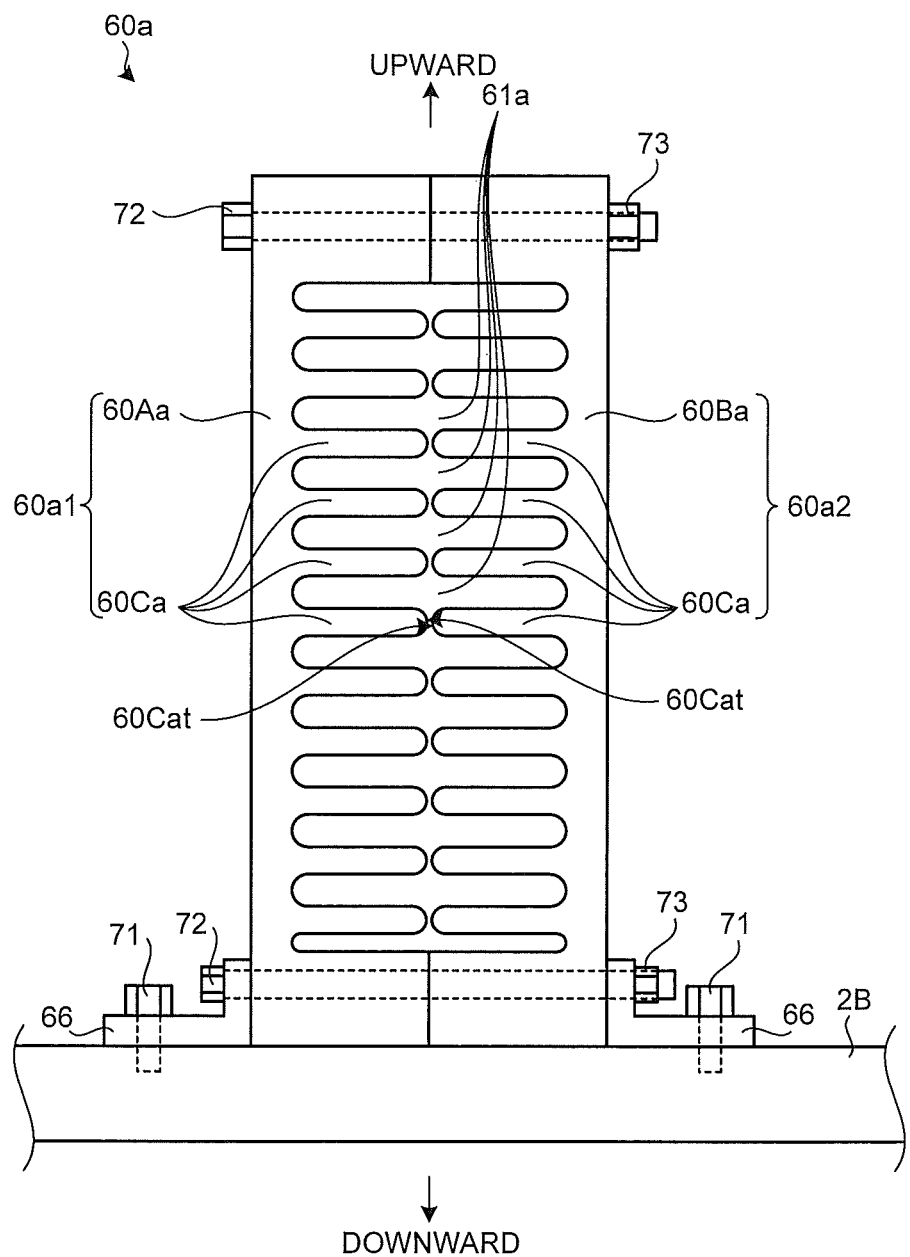
FIG. 9 is a front view of a heat sink according to a modification of the embodiment of the present invention.

FIG. 9 is a front view of a heat sink according to a modification of the embodiment of the present invention. A heat sink 60a includes a first structure 60a1 having plural plate-like members 60Ca on a first part 60Aa, and a second structure 60a2 having plural plate-like members 60Ca on a second part 60Ba. The heat sink 60a is formed such that an end 60Cat of the plate-like member 60Ca of the first structure 60a1 and the end 60Cat of the plate-like member 60Ca of the second structure 60a2 are combined to facing each other.

The first structure 60a1 and the second structure 60a2 are combined to be integral by a bolt 72 and a nut 73. The attaching member 69 is screwed together with the first structure 60a1 and the second structure 60a2 by the bolt 72 and the nut 73 on the lower part. The attaching member 69 is attached to the bottom 2B by the bolt 71. The heat sink 60 is attached to the bottom 2B via the attaching member 69. The space enclosed by the first part 60Aa, the adjacent plate-like member 60Ca on the first part 60Aa, the adjacent plate-like member 60Ca on the second part 60Ba, and the second part 60Ba becomes an air passage 61a.

The heat sink 60a can be relatively easily be produced by combining the first structure 60a1 and the second structure 60a2, both of which serve as the heat sink. The above-mentioned heat sink 60 is formed integral by the extrusion molding of the first part 60A, the second part 60B, and the plate-like member 60Ca. Therefore, it is difficult to reduce the thickness of the plate-like member 60Ca to increase its number. However, the plate-like member 60Ca of the heat sink 60a can be formed by using a cutting process, for example. Accordingly, it is relatively easy to reduce the thickness of the plate-like member 60Ca to increase its number in the heat sink 60a, compared to the heat sink 60. Consequently, the heat sink 60a has an advantage of easily increasing the heat-transfer area.

Since the heat sink 60 is formed in such a manner that the first part 60Aa and the second part 60Ab are combined to be integral, the distance between the end 60Cat of the plate-like member 60Ca on the first part 60Aa and the end 60Cat of the plate-like member 60Ca on the second part 60Ba can be decreased. Since the gap between the opposing plate-like members 61Ca and 61Ca becomes small, the air leakage from the air passage 61a can be prevented. Since the joint surface of the first part 60Aa and the joint surface of the second part 60Ab of the heat sink 60 are in contact with each other, the air is hardly leaked from the joint surface. Consequently, the heat sink 60a formed by combining the first part 60Aa and the second part 60Ab can prevent the air leakage from the air passage 61a, thereby being capable of preventing the deterioration in the cooling efficiency.

In the present embodiment, the heat sinks 60 and 60a are applied to a work machine, particularly to the battery powered forklift 1. However, the subject to which the heat sinks 60 and 60a are applied is not limited to the work machine.

While certain embodiments have been described, these embodiments are not intended to limit the scope of the inventions. Further, it should be noted that components described herein may be replaced with other components that are obvious to those skilled in the art and are substantially equal, i.e., are equivalent. Further, the components described above may be combined on an optional basis. Various omissions, substitutions and changes in the form of the embodiments described herein may be made without departing from the spirit of the embodiments.

REFERENCE SIGNS LIST

1 BATTERY POWERED FORKLIFT
2 STORAGE SPACE
2B BOTTOM
2H OPENING
3L LEFT SIDE (SIDE)
3R RIGHT SIDE (SIDE)
3RH FIRST OPENING
3LH SECOND OPENING
4 FRONT PARTITION
5 REAR PARTITION
6L, 6R SUPPORT MEMBER
10 BODY
10F FRAME
11 FRONT WHEEL
12 REAR WHEEL
13 FORK
14 MAST
16L, 16R ACCESS DOOR
20 COUNTER WEIGHT
23 WEIGHT COVER
24 BATTERY SETTING SURFACE
30 BATTERY
30B BOTTOM
31 BATTERY CASE
50 DRIVING ELECTRIC MOTOR
51 POWER TRANSMISSION DEVICE

52 CARGO-HANDLING ELECTRIC MOTOR
52P OIL PUMP
53 OPERATING OIL TANK
54 CHARGING DEVICE
55, 65, 66 FUSE
56, 63 FAN
57 CONTROL DEVICE
57D DRIVING CONTROL DEVICE
57L CARGO-HANDLING CONTROL DEVICE
58, 59 ELECTRONIC COMPONENT
60, 60a HEAT SINK
60a1 FIRST STRUCTURE
60a2 SECOND STRUCTURE
60C PARTITION MEMBER
60Ca PLATE-LIKE MEMBER
60Cat END
60A, 60Aa FIRST PART
60B, 60Ba SECOND PART
61, 61a AIR PASSAGE
61e AIR EXIT
61i AIR INLET
62 DUCT
63i AIR INLET
64 RELAY STORAGE CASE
67, 68, 70, 71, 72 BOLT
69 ATTACHING MEMBER
73 NUT
Zfr LONGITUDINAL SHAFT

The invention claimed is:

1. A battery powered work machine comprising:
a first part to which a heating element is attached;
a second part to which a heating element different from the heating element attached to the first part is attached, the second part being arranged to be opposite to the first part; and
a plurality of air passages defined between the first part and the second part for allowing air to pass,
wherein a plurality of integrally formed partition members are arranged between the first part and the second part to couple the first part and the second part, and at least one air passage is at least partially defined by a respective partition member adjacent the first and second parts,
wherein the first part, the second part, and the plurality of partition members are included in a radiator of the battery powered work machine, each of the first part and the second part is attached in such a manner that a respective portion thereof, other than a portion thereof adjacent the plurality of air passages, and other than a portion thereof adjacent the heating element, is configured for operative contact with a heat conducting member attached thereto, and
wherein a first control device for controlling a driving electric motor driven by electric power fed from a battery for allowing the machine to travel is operatively disposed in the machine anterior to a second control device in the machine, and the second control device is configured for controlling a cargo-handling electric motor driven by electric power fed from the battery, and operatively associated with an oil tank storing operating oil in the machine.

2. A battery powered work machine according to claim 1, wherein at least two of the plurality of air passages have different sizes in a direction from the first part toward the second part.

3. A battery powered work machine according to claim 1, wherein:
the radiator and the operating oil tank are arranged side by side.

4. A battery powered work machine according to claim 1, further comprising:
a fork mounted on a front of a body to which a front wheel and a rear wheel are attached;
a counter weight provided on a rear of the body; and
wherein the battery powered work machine is a forklift vehicle.

5. The battery powered work machine according to claim 4, wherein the first control device, the second control device, and the radiator are stored in a storage space in which the cargo-handling electric motor and the operating oil tank storing the operating oil are stored.

6. The battery powered work machine according to claim 4, wherein the heating element is an electronic component attached to the second part at a position opposite the second control device.

7. The battery powered work machine according to claim 4, wherein the first control device, the second control device, and the radiator are stored in a storage space in which the cargo-handling electric motor and the operating oil tank storing the operating oil are stored.

8. The battery powered work machine according to claim 4, wherein the first control device is arranged anterior to the second control device on the body.

9. The battery powered work machine according to claim 4, wherein one of the heating elements is an electronic component attached at a position opposite to the second control device.

10. A battery powered work machine comprising:
a first part to which a heating element is attached;
a second part to which a heating element different from the heating element mounted on the first part is attached, the second part being arranged to be opposite to the first part; and
a plurality of air passages provided between the first part and the second part for allowing air to pass, wherein a first structure formed by providing a plurality of partition members on the first part and a second structure formed by providing a plurality of partition members on the second part are combined in such a manner that an end of a respective partition member of the first structure and an end of a respective partition member of the second structure face one another; and
a radiator including a respective one of the air passages at least partially defined by the first part, an adjacent one of the plurality of partition members, and the second part,
wherein each of the first part and the second part is attached in such a manner that a respective portion thereof, other than a portion thereof adjacent the plurality of air passages, and other than a portion thereof adjacent the heating element, is configured for operative contact with a heat conducting member attached thereto, and
wherein a first control device for controlling a driving electric motor driven by electric power fed from a battery for allowing the machine to travel is operatively disposed in the machine anterior to a second control device in the machine with the second control device configured for controlling a cargo-handling electric motor that is driven by electric power fed from the battery, and operatively associated with an oil tank in the machine.

11. A battery powered work machine according to claim 10, wherein:
the radiator and the operating oil tank are arranged side by side.

12. A battery powered forklift comprising:
a fork mounted on a front of a body on which a front wheel and a rear wheel are attached;
a counter weight provided on a rear of the body;
a driving electric motor driven by electric power fed from a battery for allowing the body to travel;
a cargo-handling electric motor driven by electric power fed from the battery operatively associated with an oil tank in the forklift which stores operating oil;
a first part to which a first control device for controlling the driving electric motor and a second control device for controlling the cargo-handling electric motor are attached;
a second part to which an electronic component is attached, the second part disposed opposite to the first part;
a plurality of air passages provided between the first part and the second part for allowing air to pass, wherein a first structure formed by mounting a plurality of partition members on the first part and a second structure formed by mounting a plurality of partition members on the second part are combined in such a manner that an end of a respective partition member of the first structure and an end of a respective partition member of the second structure face one another; and
a radiator including a respective one of the air passages at least partially defined by the first part, an adjacent one of the plurality of partition members, and the second part, the radiator arranged side by side with the operating oil,
wherein the first control device is arranged anterior to the second control device on the body.

13. A battery powered work machine comprising:
a first part to which a heating element is attached;
a second part to which a heating element different from the heating element attached to the first part is attached, the second part being arranged to be opposite to the first part;
a plurality of air passages defined between the first part and the second part for allowing air to pass;
a fork mounted on a front of a body to which a front wheel and a rear wheel are attached; and
a counter weight provided on a rear of the body,
wherein a plurality of integrally formed partition members are arranged between the first part and the second part to couple the first part and the second part, and at least one air passage is at least partially defined by a respective one of the partition members adjacent the first and second parts,
wherein the first part, the second part, and the plurality of partition members are included in a radiator of the battery powered work machine, each of the first part and the second part is attached in such a manner that a respective portion thereof, other than a portion thereof adjacent the plurality of air passages, and other than a portion thereof adjacent the heating element, is configured for operative contact with a heat conducting member attached thereto, and
wherein a first control device for controlling a driving electric motor driven by electric power fed from a battery for allowing the machine to travel is operatively disposed in the machine anterior to a second control device in the machine with the second control device configured for controlling a cargo-handling electric motor driven by electric power fed from the battery, and operatively associated with an oil tank storing operating oil in the machine,
wherein the battery powered work machine is a forklift vehicle, and
wherein the first control device, the second control device, the electronic component, and the radiator are stored in a storage space in which the cargo-handling electric motor and the operating oil tank storing the operating oil are stored, and
wherein the storage space is provided in the body, below a bottom of the battery, and above a bottom of the body.

14. A battery powered work machine comprising:
a first part to which a heating element is attached;
a second part to which a heating element different from the heating element attached to the first part is attached, the second part being arranged to be opposite to the first part;
a plurality of air passages defined between the first part and the second part for allowing air to pass;
a fork mounted on a front of a body to which a front wheel and a rear wheel are attached; and
a counter weight provided on a rear of a body,
wherein a plurality of integrally formed partition members are arranged between the first part and the second part to couple the first part and the second part, and at least one air passage is at least partially defined by a respective partition member adjacent the first and second parts,
wherein the first part, the second part, and the plurality of partition members are included in a radiator of the battery powered work machine, each of the first part and the second part is attached in such a manner that a respective portion thereof, other than a portion thereof adjacent the plurality of air passages, and other than a portion thereof adjacent the heating element, is configured for operative contact with a heat conducting member attached thereto, and
wherein a first control device for controlling a driving electric motor driven by electric power fed from a battery for allowing the machine to travel is operatively disposed in the machine anterior to a second control device in the machine with the second control device configured for controlling a cargo-handling electric motor driven by electric power fed from the battery, and operatively associated with an oil tank in the machine,
wherein the first control device, the second control device, and the radiator are stored in a storage space in which the cargo-handling electric motor and the operating oil tank storing the operating oil are stored, and the storage space is provided in the body, below a bottom of the battery.

* * * * *